(12) United States Patent
Wang

(10) Patent No.: US 12,259,763 B2
(45) Date of Patent: Mar. 25, 2025

(54) LAYOUT METHOD OF MULTIPLE BOARD CARDS IN SERVER AND MULTIPLE-BOARD-CARD STRUCTURE OF SERVER

(71) Applicant: INSPUR SUZHOU INTELLIGENT TECHNOLOGY CO., LTD., Jiangsu (CN)

(72) Inventor: Qianhui Wang, Jiangsu (CN)

(73) Assignee: INSPUR SUZHOU INTELLIGENT TECHNOLOGY CO., LTD., Jiangsu (CN)

( * ) Notice: Subject to any disclaimer, the term of this patent is extended or adjusted under 35 U.S.C. 154(b) by 187 days.

(21) Appl. No.: 18/011,316

(22) PCT Filed: Feb. 24, 2021

(86) PCT No.: PCT/CN2021/077642
§ 371 (c)(1),
(2) Date: Dec. 19, 2022

(87) PCT Pub. No.: WO2021/253861
PCT Pub. Date: Dec. 23, 2021

(65) Prior Publication Data
US 2023/0266805 A1    Aug. 24, 2023

(30) Foreign Application Priority Data

Jun. 19, 2020 (CN) .......................... 202010568688.9

(51) Int. Cl.
G06F 1/18 (2006.01)
H05K 7/20 (2006.01)

(52) U.S. Cl.
CPC ......... G06F 1/185 (2013.01); H05K 7/20736 (2013.01)

(58) Field of Classification Search
CPC ...................................................... G06F 1/185
See application file for complete search history.

(56) References Cited

U.S. PATENT DOCUMENTS 9,059,551 B2 * 6/2015 Liu .................... H01R 12/00
10,740,271 B2 * 8/2020 Wang ................ G06F 13/4282
(Continued)

FOREIGN PATENT DOCUMENTS

CN    101984599 A    3/2011
CN    202563375 U    11/2012
(Continued)

OTHER PUBLICATIONS

Search report for International application No. PCT/CN2021/077642 mailed on Jun. 2, 2021.
(Continued)

*Primary Examiner* — David E Martinez
(74) *Attorney, Agent, or Firm* — Dennemeyer & Associates LLC

(57) ABSTRACT

Provided are a layout method of multiple board cards in a server and a multiple-board-card structure of the server, the board cards in the server include first board cards which are horizontally placed and second board cards which are vertically placed. Since the board cards are horizontally placed or vertically placed, the structure of connecting two board cards through a window opened on another board card may be realized. When link loss of board card interaction does not meet a requirement, the link length of board card interaction is shortened by using the method of connecting two board cards through a window opened on another board card, such that signal attenuation may be effectively reduced without the need of selecting a dielectric material with a
(Continued)

higher board grade for the board card, and the cost of the board cards of the server is reduced, which is beneficial for market competition.

20 Claims, 3 Drawing Sheets

(56) References Cited

U.S. PATENT DOCUMENTS

| | | | | |
|---|---|---|---|---|
| 11,869,544 | B2* | 1/2024 | Wang | H05K 7/1462 |
| 2013/0107489 | A1* | 5/2013 | Wen | H01R 13/514 |
| | | | | 361/796 |

FOREIGN PATENT DOCUMENTS

| | | | |
|---|---|---|---|
| CN | 104636307 | A | 5/2015 |
| CN | 204719626 | A | 10/2015 |
| CN | 107317770 | A | 11/2017 |
| CN | 108763771 | A | 11/2018 |
| CN | 110825187 | A | 2/2020 |
| CN | 111199135 | A | 5/2020 |
| CN | 111781992 | A | 10/2020 |

OTHER PUBLICATIONS

Search reports for Chinese application No. 202010568688.9, filed Jun. 19, 2020.

\* cited by examiner

LAYOUT METHOD OF MULTIPLE BOARD CARDS IN SERVER AND MULTIPLE-BOARD-CARD STRUCTURE OF SERVER

CROSS-REFERENCE TO RELATED APPLICATION

This application is a National Stage Filing of the PCT International Application No. PCT/CN2021/077642 filed on Feb. 24, 2021, which claims priority to Chinese patent application No. CN202010568688.9 filed to the China National Intellectual Property Administration on Jun. 19, 2020 and entitled "Layout Method of Multiple Board Cards in Server and Multiple-Board-Card Structure of Server", the disclosure of which is hereby incorporated by reference in its entirety.

TECHNICAL FIELD

The present disclosure relates to the field of server design, in particular to a layout method of multiple board cards in a server and a multi-board-card structure of the server.

BACKGROUND

Board cards are important components in a server. At present, with the improvement of the performance of the server, the number of devices on the board card, the wiring density and the signal rate are continuously improved, but a chip on the board card has certain requirements on sending and receiving of signals. In the design of the board card, an important limiting factor for meeting normal data receiving and sending between the chips is loss, which causes signal attenuation.

The total loss caused by signals transmitted between a sending chip and a receiving chip on the board card includes conductor loss, dielectric loss, radiation loss, loss caused by coupling to adjacent wires, and loss caused by impedance mismatch. Among these types of losses, the ratio of radiation loss is very small and can be ignored; loss caused by coupling to adjacent wires can be reduced by increasing the wiring spacing; loss caused by impedance mismatch can be reduced by reducing the degree of impedance mismatch; conductor loss and dielectric loss are the root causes of signal attenuation, conductor loss refers to loss of a conductor on a signal path and a return path, which is essentially caused by series resistance of the conductor; and dielectric loss refers to emery loss in a medium, which is caused by special properties of a material.

In high-speed signal transmission, dielectric loss is much larger than conductor loss, therefore, in order to reduce the total loss generated by signals transmitted between the sending chip and the receiving chip, a technical means is generally adopted as follows: a dielectric material with a relatively high board grade, namely, a dielectric material with relatively low dielectric loss, is selected for each board card in the server. However, the cost of the board card of the server is very high due to higher price of the dielectric material with relatively high board grade, which is not favorable for market competition.

Therefore, how to provide a solution to the above technical problem is a problem that needs to be solved by those having ordinary skill in the art.

SUMMARY

Embodiments of the present disclosure provide a layout method of multiple board cards in a server and a multi-board-card structure of the server. The board cards are placed either horizontally or vertically, so that the structure of connecting two board cards through a window opened on another board card may be realized. In addition, when link loss of board card interaction does not meet a requirement, the link length of board card interaction is shortened by using the method of connecting two board cards through a window opened on another board card, such that signal attenuation may be effectively reduced without the need of selecting a dielectric material with a higher board grade for the board card, and the cost of the board cards of the server is reduced, which is beneficial for market competition.

The embodiments of the present disclosure provide a layout method of multiple board cards in a server, which includes the following operations.

Multiple board cards in a server are divided in advance into first board cards which are horizontally placed and second board cards which are vertically placed, wherein a board card area of each first board card is greater than a preset area threshold, and the preset area threshold is greater than a board card area of each second board card.

A horizontal placing sequence of the first board cards is determined according to internal space of the server and interaction requirements of the multiple board cards, wherein a second target board card which is vertically placed and needs to interact with a first target board card which is horizontally placed is disposed on the first target board card.

Based on design requirements that the second target board card does not coincide in space with a first upper-layer board card located above the first target board card, and that board grades of the multiple board cards are smaller than a preset low-grade threshold, it is judged whether a minimum value of total link loss between the second target board card and the first target board card under a condition that the second target board card is disposed at periphery of the first upper-layer board card is greater than a preset loss requirement threshold.

In a case where the minimum value is greater than the preset loss requirement threshold, a window is opened on the first upper-layer board card, so that the second target board card penetrates through the window on the first upper-layer board card and is connected with the first target board card; and in a case where the minimum value is not greater than the preset loss requirement threshold, the second target board card is disposed at the periphery of the first upper-layer board card so as to be connected with the first target board card.

In at least one exemplary embodiment, the operation that whether the minimum value of the total link loss between the second target board card and the first target board card under the condition that the second target board card is disposed at the periphery of the first upper-layer board card is greater than the preset loss requirement threshold is judged includes the following operations.

Chip loss of interaction between the first target board card and the second target board card is acquired, and a minimum value of total wiring inner loss of interaction between the second target board card and the first target board card under the condition that the second target board card is disposed at the periphery of the first upper-layer board card is acquired.

The chip loss and the minimum value of the total wiring inner loss are added to obtain the minimum value of the total link loss so as to judge whether the minimum value of the total link loss is greater than the preset loss requirement threshold.

In at least one exemplary embodiment, the layout method may further include the following operations.

Under a condition that the second target board card is connected with the first target board card, the chip loss is subtracted from the preset loss requirement threshold to obtain a maximum value of residual loss.

The maximum value of residual loss is divided by a total wiring length of interaction between the first target board card and the second target board card to obtain a maximum value of wiring inner loss per unit length.

Board grades are configured for the first target board card and the second target board card based on the maximum value of wiring inner loss per unit length, so as to minimize costs of the first target board card and the second target board card, wherein the wiring inner loss per unit length decreases with increase of the board grade of a board card, and the cost increases with increase of the board grade of the board card.

In at least one exemplary embodiment, the layout method may further include the following operations.

In a case where a heat dissipation condition of adjacent board cards which are horizontally placed does not meet a heat dissipation requirement, heat dissipation windows are opened on the adjacent board cards to provide vertical ventilation heat dissipation for the adjacent board cards.

In at least one exemplary embodiment, the layout method may further include the following operations.

In a case where a height of a device disposed on the first target board card is greater than a preset height threshold, a window is opened on the first upper-layer board card, so that the device with the height greater than the preset height threshold is disposed on the first target board card in a way that the device penetrates through the window on the first upper-layer board card.

In at least one exemplary embodiment, the layout method may further include the following operations.

In a case where an interaction requirement exists between two non-adjacent board cards which are horizontally placed, a window is opened on a middle board card between the two non-adjacent board cards, so that a connecting cable therebetween realizes cross-board connection through the window on the middle board card.

The embodiments of the present disclosure provide a multi-board-card structure of a server, which includes first board cards and second board cards.

The first board cards are horizontally placed in the server.

The second board cards are vertically placed in the server.

Positions and structures of the first board cards and the second board cards are disposed based on any layout method of the multiple board cards in the server described above.

The embodiments of the present disclosure provide a layout method of multiple board cards in a server. Multiple board cards in a server are divided in advance into first board cards which are horizontally placed and second board cards which are vertically placed, wherein a board card area of each first board card is greater than a preset area threshold, and the preset area threshold is greater than a board card area of each second board card. A horizontal placing sequence of the first board cards is determined according to internal space of the server and interaction requirements of the multiple board cards, wherein a second target board card which is vertically placed and needs to interact with a first target board card which is horizontally placed is disposed on the first target board card. Based on design requirements that the second target board card does not coincide in space with a first upper-layer board card located above the first target board card, and that board grades of the multiple board cards are smaller than a preset low-grade threshold, it is judged whether a minimum value of total link loss between the second target board card and the first target board card under a condition that the second target board card is disposed at periphery of the first upper-layer board card is greater than a preset loss requirement threshold. In a case where the minimum value is greater than the preset loss requirement threshold, a window is opened on the first upper-layer board card, so that the second target board card penetrates through the window on the first upper-layer board card and is connected with the first target board card. In a case where the minimum value is not greater than the preset loss requirement threshold, the second target board card is disposed at the periphery of the first upper-layer board card so as to be connected with the first target board card.

Based on the above solution, the board cards of the present disclosure are placed either horizontally or vertically, so that the structure of connecting two board cards through a window opened on another board card may be realized. In addition, when link loss of board card interaction does not meet a requirement, the link length of board card interaction is shortened by using the method of connecting two board cards through a window opened on another board card, such that signal attenuation may be effectively reduced without the need of selecting a dielectric material with a higher board grade for the board card, and the cost of the board cards of the server is reduced, which is beneficial for market competition.

The embodiments of the present disclosure also provide a multi-board-card structure of a server, which has the same beneficial effects as the layout method.

BRIEF DESCRIPTION OF THE DRAWINGS

In order to describe the technical solutions in the embodiments of the present disclosure more clearly, the drawings required to be used in the relevant art and the embodiments will be simply introduced below, obviously, the drawings described below are only some embodiments of the present disclosure, and other drawings can further be obtained by those of ordinary skill in the art according to the drawings without creative work.

DETAILED DESCRIPTION

The embodiments of the present disclosure provide a layout method of multiple board cards in a server and a multi-board-card structure of the server. The board cards are placed either horizontally or vertically, so that the structure of connecting two board cards through a window opened on another board card may be realized. In addition, when link loss of board card interaction does not meet a requirement, the link length of board card interaction is shortened by using the method of connecting two board cards through a window opened on another board card, such that signal attenuation may be effectively reduced without the need of selecting a dielectric material with a higher board grade for the board card, and the cost of the board cards of the server is reduced, which is beneficial for market competition.

In order to make the purpose, the technical solutions and the advantages of the embodiments of the present disclosure clearer, the technical solutions in the embodiments of the present disclosure will be clearly and completely described below in combination with the drawings in the embodiments of the present disclosure, and it is apparent that the described embodiments are only a part rather all of embodiments of the present disclosure. All other embodiments obtained by those of ordinary skill in the art based on the embodiments of the present disclosure without creative efforts shall fall within the protection scope of the present disclosure.

Figure 1:
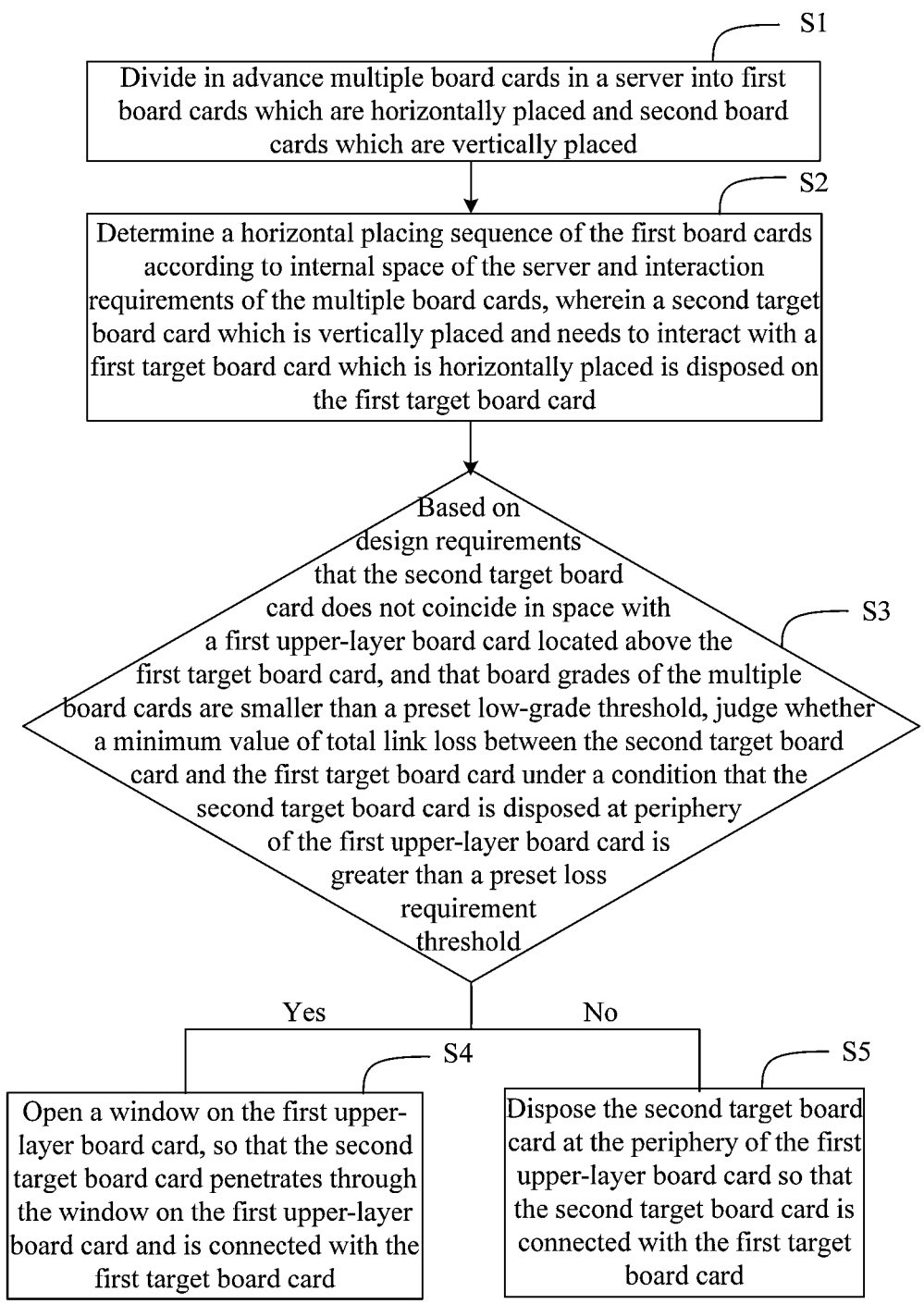
FIG. 1 is a flowchart of a layout method of multiple board cards in a server provided by an embodiment of the present disclosure.

Referring to FIG. 1, FIG. 1 is a flowchart of a layout method of multiple board cards in a server provided by an embodiment of the present disclosure.

The layout method of the multiple board cards in the server includes the following operations.

In S1, multiple board cards in a server are divided in advance into first board cards which are horizontally placed and second board cards which are vertically placed.

It is to be noted that a board card area of each first board card is greater than a preset area threshold, and the preset area threshold is greater than a board card area of each second board card. This condition in the embodiments of the present disclosure may be set in advance. The setting may be carried out only once, and no resetting is needed unless modification is required according to actual conditions.

Generally, a large number of board cards need to be placed in a server. For example, in an X86 system, a Central Processing Unit (CPU) chip or a Platform Controller Hub (PCH) chip on a substrate may receive and transmit a large number of high-speed signals, mainly including Peripheral Component Interconnect Express (PCIE), Serial ATA (SATA), Serial Attached SCSI (SAS) and other high-speed bus signals. A large number of devices, such as network cards, video cards, PCIE standard cards, hard disks and the like, may be connected to the buses, and the devices are mostly placed on the board cards, so that a large number of board cards are needed.

Considering that board card areas of board cards needing to be placed in the server are different, and the size of a case of the server is generally one selected among several fixed sizes, namely, the internal space of the server is limited, in order to facilitate reasonable utilization of the internal space of the server, in the embodiments of the present disclosure, an area threshold is set in advance, board cards (called as first board cards) with the board card area greater than the set area threshold are horizontally placed, and board cards (called as second board cards) with the board card area smaller than the set area threshold are vertically placed. In other words, the large-area first board cards are horizontally placed, and the small-area second board cards are vertically placed. In this way, the multiple board cards in the server are divided into the horizontally placed first board cards and the vertically placed second board cards, the utilization rate of the internal space of the server is improved, and the horizontal arrangement and vertical arrangement facilitate the structure of connecting two board cards through a window opened on another board card.

In S2, a horizontal placing sequence of the first board cards is determined according to internal space of the server and interaction requirements of the multiple board cards, wherein a second target board card which is vertically placed and needs to interact with a first target board card which is horizontally placed is disposed on the first target board card.

Each board card in the server needs to be provided with a chip or device, and signal transmission connection between the board cards is carried out according to system interaction requirements. Based thereon, the horizontal placing sequence of the first board cards is determined according to internal space of the server and interaction requirements of the multiple board cards, that is, which board card is on the upper layer and which board card is on the lower layer is determined. The horizontal placing sequence of the first board cards is determined based on the criteria of improving the utilization rate of the internal space of the server and at the same time facilitating signal transmission connection among the board cards, so that a reasonable design solution of the horizontal placing sequence of the first board cards may be provided.

It is to be noted that when the horizontally placed first board cards interact with each other, a cable is adopted for signal transmission connection; when a horizontally placed first board card (subsequently referred to as a first target board card) and a vertically placed second board card (subsequently referred to as a second target board card) interact with each other, the second target board card is arranged on the first target board card, and the first target board card and the second target board card are in signal transmission connection through wires on the board cards.

In S3, based on design requirements that the second target board card does not coincide in space with a first upper-layer board card located above the first target board card, and that board grades of the multiple board cards are smaller than a preset low-grade threshold, it is judged whether a minimum value of total link loss between the second target board card and the first target board card under a condition that the second target board card is disposed at periphery of the first upper-layer board card is greater than a preset loss requirement threshold. In a case where the minimum value is greater than the preset loss requirement threshold, S4 is carried out; otherwise, S5 is carried out.

In S4, a window is opened on the first upper-layer board card, so that the second target board card penetrates through the window on the first upper-layer board card and is connected with the first target board card.

In S5, the second target board card is disposed at the periphery of the first upper-layer board card so as to be connected with the first target board card.

Chips or devices disposed on the first board card and the second board card have a certain height, and when the second target board card is disposed on the first target board card, it should be guaranteed that the second target board card does not coincide in space with the first upper-layer board card located above the first target board card, that is, the placing position of the chip or device disposed on the second target board card does not conflict with the placing position of the chip or device disposed on the first upper-layer board card. Meanwhile, in order to save the cost of the board cards of the server, the board grade of each board card in the server is lower than a preset low-grade threshold.

The length of interaction link between the second target board card and the first target board card and the board grade of the board cards affect the total link loss of interaction between the first target board card and the second target board card. When the board grades of the board cards are fixed, the longer the length of interaction link between the second target board card and the first target board card, the larger the total link loss of interaction between the first target board card and the second target board card. When the length of interaction link between the second target board card and the first target board card is fixed, the lower the board grade of the board card, the larger the total link loss of interaction between the first target board card and the second target board card. Based on the design requirements, the minimum value of the total link loss between the second target board card and the first target board card under the condition that the second target board card is disposed at the periphery of the first upper-layer board card is acquired, namely, under the condition that the board grade of the board card is lower than the preset low-grade threshold, the highest board grade is selected for the board card. Under the condition that the second target board card and the first upper-layer board card do not coincide in space, the link length between the second target board card and the first target board card is the shortest when the second target board card is disposed at the periphery of the first upper-layer board card, in such a case, the value of the total link loss between the second target board card and the first target board card under the condition that the second target board card is disposed at the periphery of the first upper-layer board card is the minimum value of the total link loss.

Then, whether the obtained minimum value of total link loss is greater than a preset loss requirement threshold is judged, if the obtained minimum value of total link loss is greater than the preset loss requirement threshold, it is indicated that the design that the second target board card is disposed at the periphery of the first upper-layer board card cannot meet the link loss requirement of board card interaction, in such a case, it is a straight solution that a dielectric material with higher board grade is selected for the second target board card and the first target board card to reduce link loss, but the cost of the board cards is increased. Therefore, in the embodiments of the present disclosure, the structure of connecting two board cards through a window opened on another board card is provided. A window is opened on the first upper-layer board card, so that the second target board card penetrates through the window on the first upper-layer board card and is connected with the first target board card. By virtue of this structure, the length of interaction link between the second target board card and the first target board card is shortened, and link loss and signal attenuation may be effectively reduced without selecting a dielectric material with a higher board grade for the board card. If the obtained minimum value of the total link loss is not greater than the preset loss requirement threshold, it means that the structure that the second target board card is disposed at the periphery of the first upper-layer board card can meet the link loss requirement of board card interaction, and the second target board card is still disposed at the periphery of the first upper-layer board card and is connected with the first target board card.

It is to be noted that in a case where a window is opened on the first upper-layer board card, device layout and wiring on the first upper-layer board card may need to be re-planned for guaranteeing that the window on the first upper-layer board card does not affect the working performance of the first upper-layer board card.

Figure 2:
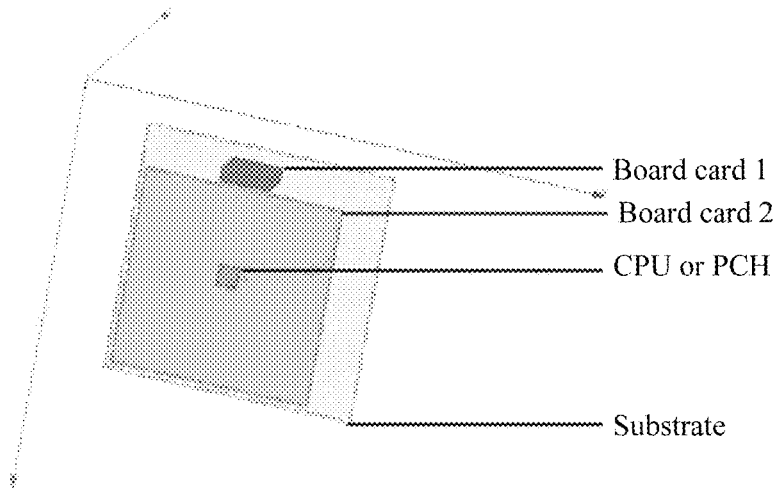
FIG. 2 is a three-dimensional view of a first multi-board-card structure of a server provided by an embodiment of the present disclosure.
Figure 3:
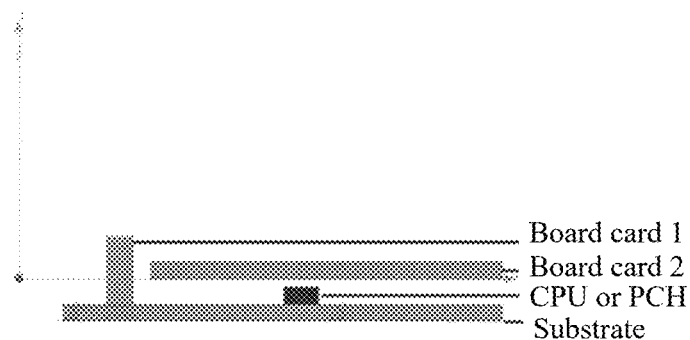
FIG. 3 is a side view a first multi-board-card structure of a server provided by an embodiment of the present disclosure.
Figure 4:
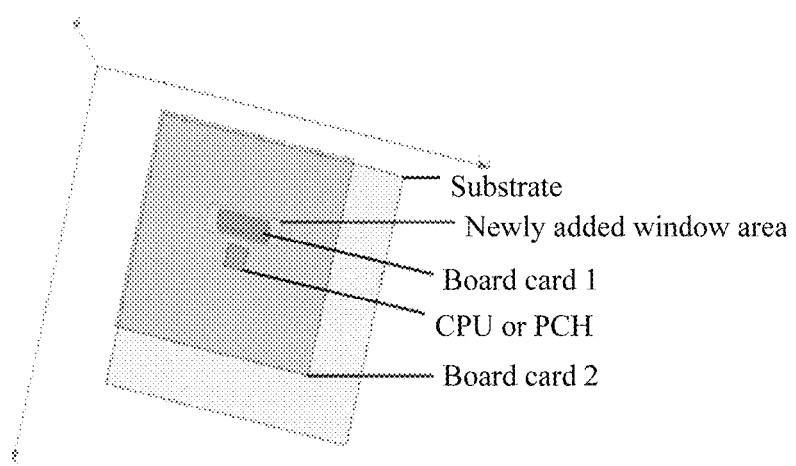
FIG. 4 is a three-dimensional view of a second multi-board-card structure of a server provided by an embodiment of the present disclosure.

For example, it is assumed that three board cards are disposed in the server, which are respectively a board card 1 which is vertically disposed, a substrate and a board card 2 which are horizontally disposed, a CPU or PCH chip is disposed on the substrate, a device disposed on the board card 1 needs to interact with the CPU or PCH chip on the substrate, based on design requirements that the board card 1 does not coincide in space with the board card 2 located above the substrate, and that board grades of the multiple board cards are smaller than a preset low-grade threshold, it is judged whether the minimum value of the total link loss between the board card 1 and the substrate under the condition that the board card 1 is disposed at the periphery of the board card 2 is greater than a preset loss requirement threshold. In a case where the minimum value is not greater than the preset loss requirement threshold, the board card 1 is disposed at the periphery of the board card 2 and is connected with the substrate, as shown in FIGS. 2 and 3. In a case where the minimum value is greater than the preset loss requirement threshold, a window is opened on the board card 2 such that the board card 1 penetrates through the window on the board card 2 and is connected with the substrate, as shown in FIG. 4.

The embodiments of the present disclosure provide the layout method of the multiple board cards in the server. Multiple board cards in a server are divided into first board cards which are horizontally placed and second board cards which are vertically placed, wherein a board card area of each first board card is greater than a preset area threshold, and the preset area threshold is greater than a board card area of each second board card. The horizontal placing sequence of the first board cards is determined according to the internal space of the server and the interaction requirements of the multiple board cards, wherein the second target board card which is vertically placed and needs to interact with the first target board card which is horizontally placed is disposed on the first target board card. Based on design requirements that the second target board card does not coincide in space with a first upper-layer board card located above the first target board card, and that board grades of the multiple board cards are smaller than a preset low-grade threshold, it is judged whether the minimum value of the total link loss between the second target board card and the first target board card under the condition that the second target board card is disposed at the periphery of the first upper-layer board card is greater than a preset loss requirement threshold. In a case where the minimum value is greater than the preset loss requirement threshold, a window is opened on the first upper-layer board card, so that the second target board card penetrates through the window on the first upper-layer board card and is connected with the first target board card. In a case where the minimum value is not greater than the preset loss requirement threshold, the second target board card is disposed at the periphery of the first upper-layer board card so as to be connected with the first target board card.

Therefore, the board cards of the present disclosure are placed either horizontally or vertically, so that the structure of connecting two board cards through a window opened on another board card may be realized. In addition, when link loss of board card interaction does not meet a requirement, the link length of board card interaction is shortened by using the method of connecting two board cards through a window opened on another board card, such that signal attenuation may be effectively reduced without the need of selecting a dielectric material with a higher board grade for the board card, and the cost of the board cards of the server is reduced, which is beneficial for market competition.

On the basis of the abovementioned embodiment, as an exemplary embodiment, the operation that whether the minimum value of the total link loss between the second target board card and the first target board card under the condition that the second target board card is disposed at the periphery of the first upper-layer board card is greater than the preset loss requirement threshold is judged includes the following operations.

Chip loss of interaction between the first target board card and the second target board card is acquired, and a minimum value of total wiring inner loss of interaction between the second target board card and the first target board card under the condition that the second target board card is disposed at the periphery of the first upper-layer board card is acquired.

The chip loss and the minimum value of the total wiring inner loss are added to obtain the minimum value of the total link loss so as to judge whether the minimum value of the total link loss is greater than a preset loss requirement threshold.

In the embodiments of the present disclosure, the operation that a minimum value of total link loss between the second target board card and the first target board card under a condition that the second target board card is disposed at periphery of the first upper-layer board card is acquired may be implemented as follows. (1) Chip loss of interaction between the first target board card and the second target board card is acquired, and a minimum value of total wiring inner loss of interaction between the second target board card and the first target board card under the condition that the second target board card is disposed at the periphery of the first upper-layer board card is acquired. For example, the total wiring inner loss=wiring inner loss per unit length× total wiring length, namely, under the condition that the board grade of the board card is lower than a preset low-grade threshold, when the highest board grade is selected for the board grade of the board card, the wiring inner loss per unit length is the minimum; meanwhile, under the condition that the second target board card and the first upper-layer board card do not coincide in space, the wiring length between the second target board card and the first target board card is the shortest when the second target board card is disposed at the periphery of the first upper-layer board card, in such a case, the value of total wiring inner loss of interaction between the second target board card and the first target board card under the condition that the second target board card is disposed at the periphery of the first upper-layer board card is the minimum value of total wiring inner loss. (2) The chip loss and the minimum value of the total wiring inner loss are added to obtain a minimum value of total link loss between the second target board card and the first target board card under a condition that the second target board card is disposed at periphery of the first upper-layer board card.

For example, as shown in FIGS. 2 and 3, the minimum value of the total link loss from the CPU on the substrate to the board card 1 is acquired. It is assumed that chip loss of interaction between the CPU and the board card 1 is 7 dB. Under the condition that the board grade of the board card is lower than a preset low-grade threshold, when the highest board grade is selected for the board card, the wiring inner loss per unit length is about 0.5 dB/inch, and the minimum wiring length of interaction between the CPU and the board card 1 is 33 inch (the wiring length 25 inch on the substrate+ the wring length 8 inch on the board card 1), therefore, the minimum value of the total link loss from the CPU on the substrate to the board card 1 is equal to 7 dB+0.5 dB/inch× 33 inch=23.5 dB.

If the minimum value of the total link loss from the CPU on the substrate to the board card 1 is greater than a preset loss requirement threshold (set as 22 dB), the structure shown in FIG. 4 is selected, and the total link loss from the CPU on the substrate to the board card 1 is acquired as follows. The wiring length on the substrate is shortened from 25 inch to 12 inch, the wiring length 8 inch on the board card 1 is not changed, the total wiring length of interaction between the CPU and the board card 1 is 20 inch, and the total link loss from the CPU on the substrate to the board card 1 is equal to 7 dB+0.5 dB/inch×20 inch=17 dB, so that the link loss is effectively reduced.

As an exemplary embodiment, the layout method may further include the following operations.

Under a condition that the second target board card is connected with the first target board card, the chip loss is subtracted from the preset loss requirement threshold to obtain a maximum value of residual loss.

The maximum value of residual loss is divided by a total wiring length of interaction between the first target board card and the second target board card to obtain a maximum value of wiring inner loss per unit length.

Board grades are configured for the first target board card and the second target board card based on the maximum value of wiring inner loss per unit length, so as to minimize costs of the first target board card and the second target board card. The wiring inner loss per unit length decreases with increase of the board grade of a board card, and the cost increases with increase of the board grade of the board card.

Furthermore, under a condition that the second target board card is connected with the first target board card, that is, the positions of the second target board card and the first target board card are determined, the chip loss of the interaction between the first target board card and the second target board card is subtracted from the preset loss requirement threshold to obtain the maximum value of residual loss, specifically, the maximum value of residual loss is greater than or equal to the total wring inner loss of interaction between the first target board card and the second target board card. Because the total wiring inner loss=wiring inner loss per unit length×total wiring length (the total wiring length is already determined), in order to enable the costs of the first target board card and the second target board card to be the lowest, namely, the lowest available board grade and the maximum value of the wiring inner loss per unit length are selected for the board card, the value of the total wiring inner loss of interaction between the first target board card and the second target board card is equal to the maximum value of residual loss, so that the maximum value of the wiring inner loss per unit length may be ensured.

Based thereon, the maximum value of residual loss is divided by the minimum value of total wiring length of interaction between the first target board card and the second target board card to obtain the maximum value of wiring inner loss per unit length, and then board grades are configured for the first target board card and the second target board card based on the maximum value of wiring inner loss per unit length. Specifically, under the premise that the wiring inner loss per unit length corresponding to the board grade of the board card is smaller than the maximum value of the wiring inner loss per unit length, the lowest board grades are selected for the first target board card and the second target board card, so as to minimize costs of the first target board card and the second target board card.

For example, as shown in FIG. 4, the wiring inner loss per unit length of the board which is one grade lower than that of the board with the wiring inner loss per unit length of about 0.5 dB/inch is about 0.7 dB/inch, the total link loss from the CPU on the substrate to the board card 1 is equal to 7 dB+0.7 dB/inch×20 inch=21 dB, and the link loss requirement of board card interaction is met as well. Therefore, on the basis of the structure of connecting two board cards through a window opened on another board card, the dielectric material with a lower board grade may be selected for the board card, so that the cost of the board card is further saved.

As an exemplary embodiment, the layout method may further include the following operations.

In a case where a heat dissipation condition of adjacent board cards which are horizontally placed does not meet a heat dissipation requirement, heat dissipation windows are opened on the adjacent board cards to provide vertical ventilation heat dissipation for the adjacent board cards.

Furthermore, considering that the horizontally placed board cards have good ventilation effect in the horizontal direction, which is beneficial for heat dissipation of devices on the board card, but the situation that heat dissipation of the horizontally placed board cards does not meet the heat dissipation requirement may exist, therefore, in the embodiments of the present disclosure, in a case where a heat dissipation condition of adjacent board cards which are horizontally placed does not meet a heat dissipation requirement, heat dissipation windows are opened on the adjacent board cards to provide vertical ventilation heat dissipation for the adjacent board cards, so that the heat dissipation effect is improved.

It is to be noted that when heat dissipation windows are opened on the adjacent board cards, it should be guaranteed that the windows on the adjacent board cards do not affect the working performance of the adjacent board cards.

As an exemplary embodiment, the layout method may further include the following operations.

In a case where a height of a device disposed on the first target board card is greater than a preset height threshold, a window is opened on the first upper-layer board card, so that the device with the height greater than the preset height threshold is disposed on the first target board card in a way that the device penetrates through the window on the first upper-layer board card.

Furthermore, considering that the devices on some horizontally placed board card are high, resulting in further distances from the upper-layer board card to the current board card, more internal space of the server is occupied, therefore, in the present disclosure, in a case where a height of a device disposed on the first target board card is greater than a preset height threshold, a window is opened on the first upper-layer board card, so that the device with the height greater than the preset height threshold is disposed on the first target board card in a way that the device penetrates through the window on the first upper-layer board card, thereby improving the utilization ratio of the internal space of the server.

It is to be noted that when a window is opened on the first upper-layer board card, it should be guaranteed that the window on the first upper-layer board card does not affect the working performance of the first upper-layer board card.

As an exemplary embodiment, the layout method may further include the following operations.

In a case where an interaction requirement exists between two non-adjacent board cards which are horizontally placed, a window is opened on a middle board card between the two non-adjacent board cards, so that a connecting cable between the two non-adjacent board cards realizes cross-board connection through the window on the middle board card.

Furthermore, when the horizontally placed first board cards are in signal transmission connection through an interaction cable, the cable on the outer sides of the board card is disordered, meanwhile, the internal space of the server is occupied, therefore, in a case where an interaction requirement exists between two non-adjacent board cards which are horizontally placed, a window is opened on a middle board card between the two non-adjacent board cards, so that the connecting cable between the two non-adjacent board cards which are horizontally placed realizes cross-board connection through the window on the middle board card. As such, no cable is arranged on the outer side of the board card, the structure is neat, and the utilization rate of the internal space of the server is improved.

It is to be noted that when a window is opened on the middle board card, it should be guaranteed that the window on the middle board card does not affect the working performance of the middle board card.

The embodiments of the present disclosure further provide a multi-board-card structure of a server, which includes first board cards and second board cards.

The first board cards are horizontally placed in the server.

The second board cards are vertically placed in the server.

Positions and structures of the first board cards and the second board cards are disposed based on any layout method of the multiple board cards in the server described above.

The multi-board-card structure of the server provided by the embodiments of the present disclosure has already been introduced in the embodiments of the layout method described above, and therefore will not be repeated here.

It is further noted that in the specification, relational terms such as first and second, and like, are used merely to distinguish one entity or operation from another entity or operation without necessarily requiring or implying any actual such relationship or order between such entities or operations. Terms "include" and "contain" or any other variant thereof is intended to cover nonexclusive inclusions herein, so that a process, method, object or device including a series of elements not only includes those elements but also includes other elements which are not clearly listed or may further include elements intrinsic to the process, the method, the object or the device. An element defined by the statement "includes a . . . " does not, without more constraints, preclude the existence of additional identical elements in the process, method, article, or apparatus that includes the element.

The previous description of the disclosed embodiments enables those having ordinary skill in the art to implement or use the present disclosure. Various modifications to these embodiments will be readily apparent to those having ordinary skill in the art, and the generic principles defined herein may be implemented in other embodiments without departing from the spirit or scope of the present disclosure. Thus, the present disclosure is not to be limited to these embodiments shown herein but is to be accorded the widest scope consistent with the principles and novel features disclosed herein.

What is claimed is:

1. A layout structure of multiple board cards in a server, comprising:
    first board cards which are horizontally placed in a server; and
    second board cards which are vertically placed in the server;
    wherein positions and structures of the first board cards and the second board cards are disposed as follows:
    a board card area of each first board card is greater than a preset area threshold, and the preset area threshold is greater than a board card area of each second board card;
    the first board cards are placed in a horizontal placing sequence according to internal space of the server and interaction requirements of the multiple board cards, wherein a second target board card which is vertically placed and needs to interact with a first target board card which is horizontally placed is disposed on the first target board card;

for each first target board card and each second target board card;

based on design requirements that the second target board card does not coincide in space with a first upper-layer board card located above the first target board card, and that board grades of the multiple board cards are smaller than a preset low-grade threshold, in a case where a minimum value of total link loss between the second target board card and the first target board card under a condition that the second target board card is disposed at periphery of the first upper-layer board card is greater than a preset loss requirement threshold, a window is opened on the first upper-layer board card, so that the second target board card penetrates through the window on the first upper-layer board card and is connected with the first target board card; and in a case where the minimum value is not greater than the preset loss requirement threshold, the second target board card is disposed at the periphery of the first upper-layer board card so that the second target board card is connected with the first target board card.

2. The layout structure of multiple board cards in a server according to claim 1, wherein the minimum value of the total link loss is a sum of chip loss of interaction between the first target board card and the second target board card, and a minimum value of total wiring inner loss of interaction between the second target board card and the first target board card under the condition that the second target board card is disposed at the periphery of the first upper-layer board card.

3. The layout structure of multiple board cards in a server according to claim 2, wherein the first target board card and the second target board card adopt board grades selected based on a maximum value of wiring inner loss per unit length, so as to minimize costs of the first target board card and the second target board card, wherein the maximum value of wiring inner loss per unit length is obtained by dividing the maximum value of residual loss by a total wiring length of interaction between the first target board card and the second target board card, and the maximum value of residual loss is obtained by subtracting the chip loss from the preset loss requirement threshold under a condition that the second target board card is connected with the first target board card.

4. The layout structure of multiple board cards in a server according to claim 3, wherein the wiring inner loss per unit length decreases with increase of the board grade of a board card, and the cost increases with increase of the board grade of the board card.

5. The layout structure of multiple board cards in a server according to claim 1, wherein in a case where a heat dissipation condition of adjacent board cards which are horizontally placed does not meet a heat dissipation requirement, heat dissipation windows are opened on the adjacent board cards to provide vertical ventilation heat dissipation for the adjacent board cards.

6. The layout structure of multiple board cards in a server according to claim 1, wherein in a case where a height of a device disposed on the first target board card is greater than a preset height threshold, a window is opened on the first upper-layer board card, so that the device with the height greater than the preset height threshold is disposed on the first target board card in a way that the device penetrates through the window on the first upper-layer board card.

7. The layout structure of multiple board cards in a server according to claim 1, wherein in a case where an interaction requirement exists between two non-adjacent board cards which are horizontally placed, a window is opened on a middle board card between the two non-adjacent board cards, so that a connecting cable between the two non-adjacent board cards realizes cross-board connection through the window on the middle board card.

8. The layout structure of multiple board cards in a server according to claim 1, wherein a placing position of the chip or device disposed on the second target board card does not conflict with a placing position of the chip or device disposed on the first upper-layer board card.

9. A layout method of multiple board cards in a server which is used for implementing the layout structure according to claim 1, comprising:

dividing in advance multiple board cards in the server into first board cards which are horizontally placed and second board cards which are vertically placed, wherein a board card area of each first board card is greater than a preset area threshold, and the preset area threshold is greater than a board card area of each second board card;

determining a horizontal placing sequence of the first board cards according to internal space of the server and interaction requirements of the multiple board cards, wherein a second target board card which is vertically placed and needs to interact with a first target board card which is horizontally placed is disposed on the first target board card;

based on design requirements that the second target board card does not coincide in space with a first upper-layer board card located above the first target board card, and that board grades of the multiple board cards are smaller than a preset low-grade threshold, judging whether a minimum value of total link loss between the second target board card and the first target board card under a condition that the second target board card is disposed at periphery of the first upper-layer board card is greater than a preset loss requirement threshold;

in a case where the minimum value is greater than the preset loss requirement threshold, opening a window on the first upper-layer board card, so that the second target board card penetrates through the window on the first upper-layer board card and is connected with the first target board card; and in a case where the minimum value is not greater than the preset loss requirement threshold, disposing the second target board card at the periphery of the first upper-layer board card so that the second target board card is connected with the first target board card.

10. The layout method of multiple board cards in a server according to claim 9, wherein judging whether the minimum value of the total link loss between the second target board card and the first target board card under the condition that the second target board card is disposed at the periphery of the first upper-layer board card is greater than the preset loss requirement threshold comprises:

acquiring chip loss of interaction between the first target board card and the second target board card, and acquiring a minimum value of total wiring inner loss of interaction between the second target board card and the first target board card under the condition that the second target board card is disposed at the periphery of the first upper-layer board card;

adding the chip loss and the minimum value of the total wiring inner loss to obtain the minimum value of the total link loss so as to judge whether the minimum value of the total link loss is greater than the preset loss requirement threshold.

11. The layout method of multiple board cards in a server according to claim 10, further comprising:
- under a condition that the second target board card is connected with the first target board card, subtracting the chip loss from the preset loss requirement threshold to obtain a maximum value of residual loss;
- dividing the maximum value of residual loss by a total wiring length of interaction between the first target board card and the second target board card to obtain a maximum value of wiring inner loss per unit length;
- configuring board grades for the first target board card and the second target board card based on the maximum value of wiring inner loss per unit length, so as to minimize costs of the first target board card and the second target board card.

12. The layout method of multiple board cards in a server according to claim 11, wherein the wiring inner loss per unit length decreases with increase of the board grade of a board card, and the cost increases with increase of the board grade of the board card.

13. The layout method of multiple board cards in a server according to claim 9, further comprising:
- in a case where a heat dissipation condition of adjacent board cards which are horizontally placed does not meet a heat dissipation requirement, opening heat dissipation windows on the adjacent board cards to provide vertical ventilation heat dissipation for the adjacent board cards.

14. The layout method of multiple board cards in a server according to claim 9, further comprising:
- in a case where a height of a device disposed on the first target board card is greater than a preset height threshold, opening a window on the first upper-layer board card, so that the device with the height greater than the preset height threshold is disposed on the first target board card in a way that the device penetrates through the window on the first upper-layer board card.

15. The layout method of multiple board cards in a server according to claim 9, further comprising:
- in a case where an interaction requirement exists between two non-adjacent board cards which are horizontally placed, opening a window on a middle board card between the two non-adjacent board cards, so that a connecting cable between the two non-adjacent board cards realizes cross-board connection through the window on the middle board card.

16. The layout method of multiple board cards in a server according to claim 9, wherein a placing position of the chip or device disposed on the second target board card does not conflict with a placing position of the chip or device disposed on the first upper-layer board card.

17. The layout method of multiple board cards in a server according to claim 9, further comprising:
- re-planning device layout and wiring on the first upper-layer board card so that the window on the first upper-layer board card does not affect working performance of the first upper-layer board card.

18. A server comprising multiple board cards which have the layout structure according to claim 1.

19. A server comprising multiple board cards which have the layout structure according to claim 5.

20. A server comprising multiple board cards which have the layout structure according to claim 6.

* * * * *